(12) United States Patent
Tinnemeyer

(10) Patent No.: US 9,851,408 B2
(45) Date of Patent: Dec. 26, 2017

(54) METHODS AND APPARATUS FOR BATTERY TESTING

(71) Applicant: CADEX Electronics Inc., Richmond (CA)

(72) Inventor: Joern A. Tinnemeyer, Richmond (CA)

(73) Assignee: CADEX Electronics Inc., Richmond, CA (US)

( * ) Notice: Subject to any disclaimer, the term of this patent is extended or adjusted under 35 U.S.C. 154(b) by 872 days.

(21) Appl. No.: 13/693,859

(22) Filed: Dec. 4, 2012

(65) Prior Publication Data
US 2013/0093428 A1 Apr. 18, 2013

Related U.S. Application Data

(63) Continuation-in-part of application No. 12/994,847, filed as application No. PCT/CA2009/000777 on Jun. 5, 2009, now abandoned.

(60) Provisional application No. 61/059,151, filed on Jun. 5, 2008.

(51) Int. Cl.
G01R 31/36 (2006.01)
H01M 10/42 (2006.01)
H01M 10/48 (2006.01)

(52) U.S. Cl.
CPC ..... *G01R 31/3606* (2013.01); *G01R 31/3634* (2013.01); *H01M 10/42* (2013.01); *H01M 10/4285* (2013.01); *H01M 10/48* (2013.01)

(58) Field of Classification Search
CPC .......................... G01R 31/3648; G01R 31/3662
USPC ....................................................... 324/426
See application file for complete search history.

(56) References Cited

U.S. PATENT DOCUMENTS

| 5,059,902 | A | * | 10/1991 | Linder | G01B 7/023 324/204 |
| 5,093,624 | A | * | 3/1992 | Stevenson | H02J 7/0077 324/426 |
| 5,250,903 | A | * | 10/1993 | Limuti | H01M 10/484 324/204 |
| 5,537,042 | A | * | 7/1996 | Beutler | G01R 27/02 324/234 |
| 5,675,252 | A | | 10/1997 | Podney | |
| 6,033,798 | A | | 3/2000 | Tabuchi et al. | |

(Continued)

FOREIGN PATENT DOCUMENTS

EP   0580241 A2   1/1994
JP   10-228889 A2   8/1998

(Continued)

OTHER PUBLICATIONS

Shen, et al., "In situ detection of single micron-sized magnetic beads using magnetic tunnel junction sensors", Applied Physics Letters 86, 253901 (2005).

(Continued)

*Primary Examiner* — Drew A Dunn
*Assistant Examiner* — Jerry D Robbins
(74) *Attorney, Agent, or Firm* — Oyen Wiggs Green & Mutala LLP

(57) ABSTRACT

Methods and apparatus for testing electrical storage batteries monitor magnetic susceptibility of components of the storage batteries. In some embodiments, magnetic susceptibility of a plate in a lead-acid battery is determined to provide an indication of the state of charge of the battery.

16 Claims, 7 Drawing Sheets

(56) References Cited

U.S. PATENT DOCUMENTS

| | | |
|---|---|---|
| 6,456,988 B1 | 9/2002 | Singh et al. |
| 6,461,767 B1 | 10/2002 | Dansui et al. |
| 6,833,980 B1 | 12/2004 | Tsukagoshi et al. |
| 7,205,746 B2 * | 4/2007 | Batson ............... H02J 7/0047 320/107 |
| 2003/0020479 A1 | 1/2003 | Koch et al. |
| 2003/0204328 A1 * | 10/2003 | Tinnemeyer ....... G01R 31/3662 702/30 |
| 2004/0178918 A1 | 9/2004 | Lockhart et al. |
| 2004/0196681 A1 | 10/2004 | Xiao et al. |
| 2005/0218001 A1 * | 10/2005 | You ....................... C25B 15/02 205/89 |
| 2006/0051659 A1 | 3/2006 | Kelly et al. |
| 2007/0182367 A1 * | 8/2007 | Partovi ................. H01F 5/003 320/108 |
| 2009/0027056 A1 * | 1/2009 | Huang ............... B60L 11/1857 324/439 |
| 2009/0115420 A1 * | 5/2009 | Koch ................. G01R 31/3648 324/432 |
| 2010/0094575 A1 * | 4/2010 | Andrieu ............. G01R 31/3668 702/63 |
| 2010/0292942 A1 * | 11/2010 | Golf .................... H01M 10/445 702/63 |
| 2013/0154652 A1 * | 6/2013 | Rice ................... G01R 31/3606 324/426 |

FOREIGN PATENT DOCUMENTS

| | | |
|---|---|---|
| JP | 2001-076730 A | 3/2001 |
| JP | 2004-199910 A | 7/2004 |
| WO | 2010091170 A1 | 8/2010 |

OTHER PUBLICATIONS

Schrag, B.D. et al., "Magnetic current imaging with magnetic tunnel junction sensors: case study and analysis", Proceedings of the 2006 International Symposium for Testing and Failure Analysis (2006).

Nan, C-W., et al., "Large magnetoelectric response in multiferroic polymer-based composites", Phys. Rev. B 71, 014102 (2005).

Ryu, et al., "Magnetoelectric Effect in Composites of Magnetostrictive and Piezoelectric Materials", Journal of Electroceramics, 8, 107-119 (Aug. 2002).

Xing, Z.P. et al., "Modeling and detection of quasi-static nanotesla magnetic field variations using magnetoelectric laminate sensors", Meas. Sci. Technol. 19, 015206 (2008).

Nathan, A., "How to achieve nanotesla resolution with integrated silicon magnetotransistors", Electron Devices Meeting, 1989, IEDM '89, pp. 511-514 (Dec. 3-6, 1989).

Nguyen, V.D.F., "Magnetic sensors for nanotesla detection using planar Hall effect", Sensors and actuators, A, vol. 53, No. 1-3, pp. 256-620 (1996).

* cited by examiner

METHODS AND APPARATUS FOR BATTERY TESTING

CROSS-REFERENCE TO RELATED APPLICATIONS

This application is a continuation-in-part of U.S. patent application Ser. No. 12/994,847 filed on 5 Jun. 2009 and entitled METHODS AND APPARATUS FOR BATTERY TESTING which is hereby incorporated by reference herein for all purposes. This application claims the benefit under 35 U.S.C. §119 of U.S. patent application No. 61/059,151 filed on 5 Jun. 2008 and entitled METHODS AND APPARATUS FOR BATTERY TESTING.

TECHNICAL FIELD

The invention relates to battery testing. Certain embodiments of the invention relate to testing lead-acid batteries. The invention also has application to testing batteries having other chemistries such as lithium ion batteries.

BACKGROUND

Batteries are used to supply electricity in a wide range of applications. In the automotive field, batteries are used to supply power for vehicle systems which may include engine starting, lighting, electronic accessories, propulsion, control systems and the like. Newer vehicles include an increasing number of systems that require electricity for operation. Some, such as electronically controlled braking systems and electronic engine control systems, are vital to safe vehicle operation.

Where a critical system is powered by a battery then it can be important to monitor the state of the battery. Battery testing systems are used to evaluate the state of charge (SoC) of batteries as well as the condition (sometimes referred to as the state of health (SoH)) of batteries as well as the amount of power that a battery can supply (sometimes referred to as the state of function (SoF) of the battery). Battery testing systems typically monitor electrical characteristics of batteries. For example, some such systems monitor the impedance of a battery at various frequencies.

A problem with many existing battery testing systems is that the systems are not accurate, especially for batteries that are not new. Such systems can yield estimates of a battery's state of charge that are inaccurate.

There is a need for accurate systems and methods for monitoring the state of batteries.

SUMMARY

The invention has a number of aspects. One aspect relates to methods for testing electrochemical batteries. Another aspect relates to apparatus for testing electrochemical batteries.

An example aspect provides a method for determining a state of an electrochemical battery. The method comprises exposing an electrode of the electrochemical battery to an electromagnetic excitation field; measuring magnetism induced in the electrode by the electromagnetic excitation field; and determining the state of the electrochemical battery based at least in part on the measured induced magnetism.

In some embodiments the method comprises discontinuing the electromagnetic excitation field before measuring the induced magnetism (as a residual magnetism of the electrode). In some embodiments the method comprises applying an AC excitation field. In example embodiments the excitation field has a frequency in the range of 1 kHz to 20 kHz.

Another example aspect of the invention provides apparatus for determining a state of an electrochemical battery. The apparatus comprises an excitation field generator configured to apply an electromagnetic excitation field to an electrode of the electrochemical battery; a magnetic field detector positionable to determine an induced magnetization induced in the electrode by the excitation field; and, a controller configured to determine the state of the electrochemical battery based at least in part on the induced magnetization. The controller may be configured to discontinue application of the electromagnetic excitation field before measuring the induced magnetism.

Further aspects of the invention and features of example embodiments of the invention are described below and/or illustrated in the accompanying drawings.

BRIEF DESCRIPTION OF THE DRAWINGS

The appended drawings illustrate non-limiting embodiments of the invention.

DESCRIPTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive, sense.

Apparatus and methods according to this invention measure battery state based on changes in the magnetic susceptibility of battery components. The battery component may comprise an electrode of the battery that undergoes a chemical change as the battery is charged or discharged.

Figure 1:
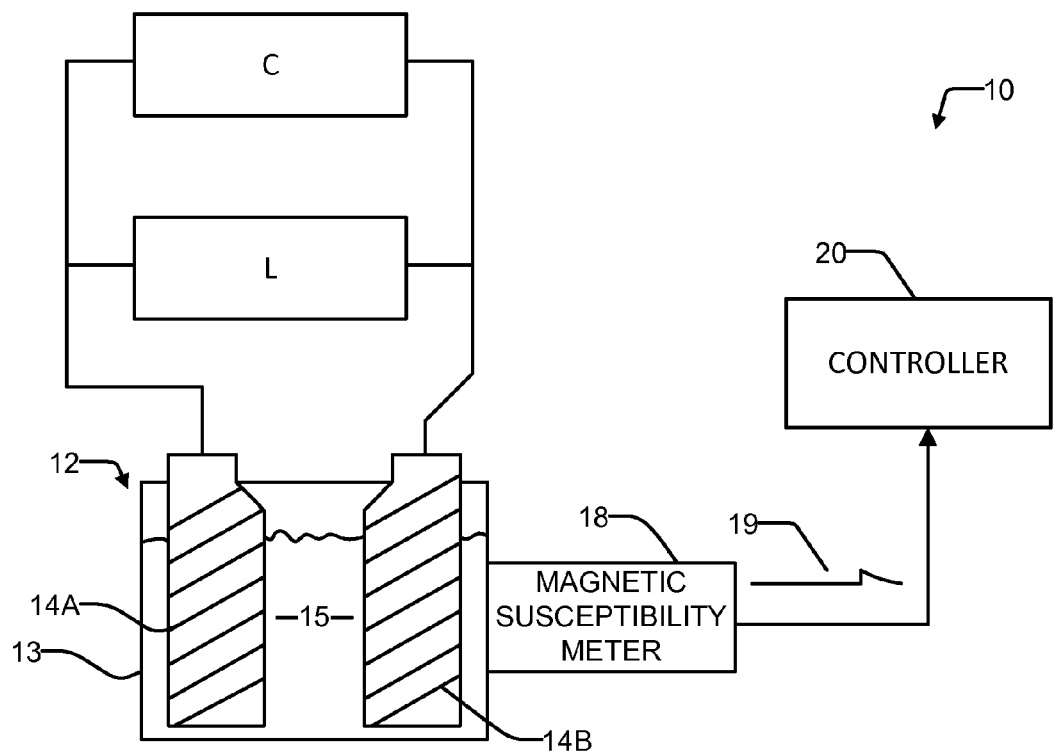
FIG. 1 is a block diagram of a battery testing system according to an example embodiment of the invention.

FIG. 1 shows a battery testing apparatus 10 connected to test a battery 12. Battery 12 comprises a case 13 housing electrodes 14A and 14B (collectively electrodes 14) immersed in an electrolyte 15. In FIG. 1, battery 12 is illustrated as having only one cell. Battery 12 may have any suitable number of cells. Battery 12 can deliver electrical power to a load L and can be charged by a charger C.

The chemical composition of at least one of electrodes 14 changes as the battery is charged and discharged. Consider, for example, the case where battery 12 is a lead-acid battery. In a lead acid battery electrode 14B comprises a lead anode and electrode 14A comprises a lead dioxide cathode. Electrolyte 15 is an acid electrolyte.

During discharge, the following half reaction occurs at anode 14B:

(1)

And the following half reaction occurs at cathode 14A:

(2)

During charging, the reactions at each electrode are reversed. What is of interest is that the chemical composition of each electrode changes as the battery is charged and discharged.

The magnetic characteristics of electrodes in batteries of other types also change as the batteries are charged and discharged. For example, in a lithium ion battery lithium ions move to the positive electrode as the battery discharges. When a lithium ion battery is charged the lithium ions are moved to the negative electrode. Consequently, magnetic properties (e.g. magnetic susceptibility) of both the negative and positive electrodes change depending on the state of charge of a lithium ion battery. Since the presence of lithium ions tends to augment magnetic fields, the magnetism induced in the negative electrode of a lithium-ion battery by application of an exciting electromagnetic field tends to increase as the state of charge of the battery increases.

Electrodes in batteries of other chemistries also change in composition as the batteries are charged and discharged. This leads to consequential changes in the magnetic properties of the electrodes. The nature of the changes depends on the chemistry of the batteries.

Apparatus 10 exploits changes in the magnetic susceptibility of an electrode 14, which correspond to the chemical changes in the electrode 14, to derive information indicative of the state of battery 12. For example, apparatus 10 may derive information indicative of the state of charge of battery 12. Magnetic susceptibility is a measure of the degree to which a material becomes magnetized in response to an applied magnetic field.

Lead has a magnetic susceptibility of $-23 \times 10^{-6}$ in cgs units while lead sulfate has a magnetic susceptibility of about $-70 \times 10^{-6}$. Thus, as battery 12 is discharged and the ratio of lead sulfate to lead in anode 14B increases, the magnetic susceptibility of anode 14B also increases (i.e., anode 14B become more diamagnetic, and will exhibit greater magnetization in response to a given applied magnetic field). Similarly, as battery 12 is charged, the ratio of lead sulfate to lead in anode 14B decreases and the magnetic susceptibility of anode 14B decreases (i.e., anode 14B become less diamagnetic, and will exhibit less magnetization in response to a given applied magnetic field). Thus, the magnetic susceptibility of anode 14B can be correlated to the state of charge of battery 12. The magnetic susceptibility of cathode 14A also changes with the state of charge of battery 12 but the changes at cathode 14A are smaller than the changes in magnetic susceptibility of anode 14B because the difference between the magnetic susceptibilities of lead dioxide and lead sulfate is smaller than the difference between the magnetic susceptibilities of lead and lead sulfate.

In the embodiment of FIG. 1, apparatus 10 comprises a magnetic susceptibility meter 18 which provides an output signal 19 that changes in response to changes in the magnetic susceptibility of anode 14B. Signal 19 is provided to a controller 20. Controller 20 takes action based on the value of signal 19. Examples of actions that may be taken by controller 20 in various applications include:

Computing and displaying an estimate of state of charge. The estimate may be in arbitrary units such as 0 to 10, 0 to 100, GOOD-FAIR-POOR or the like. The estimate may be displayed in terms of numerical or other charge values and/or in the form of a bar graph or other visual display.

Shutting down and/or placing into a reduced power mode one or more components that are included in load L in response to determining that the state of charge is below a threshold.

Generating a warning signal to alert an operator that the state of charge is below a threshold. The warning may be a visual or audible warning or an electronic signal delivered to another control system, an electronic message such as an e-mail, instant message or the like, etc.

Controller 20 may comprise a programmed data processor, logic circuits or the like. In some embodiments, controller 20 comprises a calibration function that associates values of signal 19 with values indicative of battery state of charge. The calibration function may comprise a look-up table, a set of one or more parameters of an equation relating values of signal 19 to the state of charge of battery 12 or the like.

Figure 2:
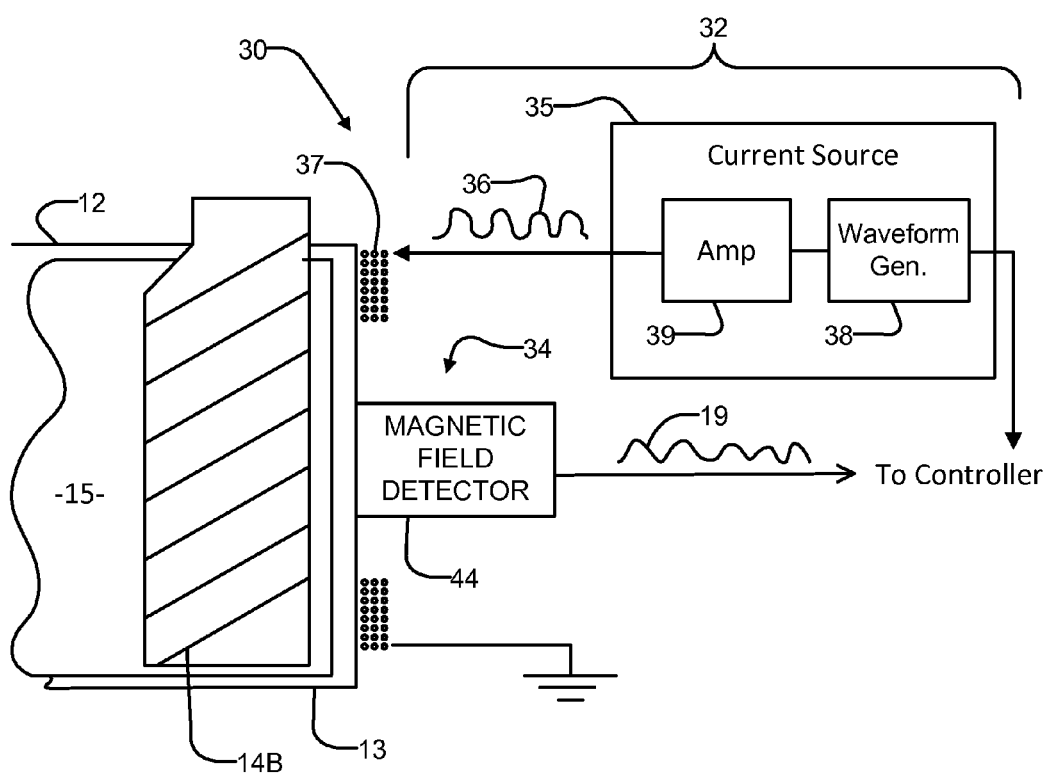
FIG. 2 shows an apparatus according to a more detailed example embodiment.

FIG. 2 shows apparatus 30 according to a more detailed example embodiment. Apparatus 30 comprises a magnetic field source 32 and a magnetic field detector 34. In the illustrated embodiment, magnetic field source 32 and magnetic field detector 34 are mounted on the outside of case 13 adjacent to an electrode 14B. In the illustrated embodiment, magnetic field source 32 comprises an electrical current source 35 that is connected to pass electrical current through a conductor 37. Preferably conductor 37 has multiple windings so that a magnetic field large enough to obtain a measure of the magnetic susceptibility of electrode 14B can be achieved at relatively low levels of electric current supplied by current source 35. For example, conductor 37 may be in the form of a coil or spiral. In some embodiments, conductor 37 is provided as part of an assembly that can be adhered to case 13. The assembly may have a self-adhesive face or self-adhesive patches to allow the assembly to be affixed to case 13.

In some embodiments, conductor 37 is patterned on a circuit board. Conductor 37 may, for example, comprise a spiral patterned on a circuit board. The circuit board may have multiple layers each patterned with a conductor such that magnetic fields generated by current passing through the conductors of each layer reinforce one another. In other embodiments, conductor 37 may comprise one or more coils of fine wire.

Current source 35 may provide a current 36 that is time-varying such that the magnetic field of conductor 37 is time varying. This may cause signal 19 to be time-varying. Controller 20 may use the time variations in signal 19 to reject noise. The noise will not vary with time in the same way as current 36. In the example embodiment illustrated in FIG. 2, current source 35 comprises a waveform generator 38 coupled to drive an amplifier 39. The output of amplifier 39 is connected to drive a current in conductor 37. In some embodiments, the magnetic field is time varying at a frequency in the range of 1 kHz to 20 kHz.

Figure 3:
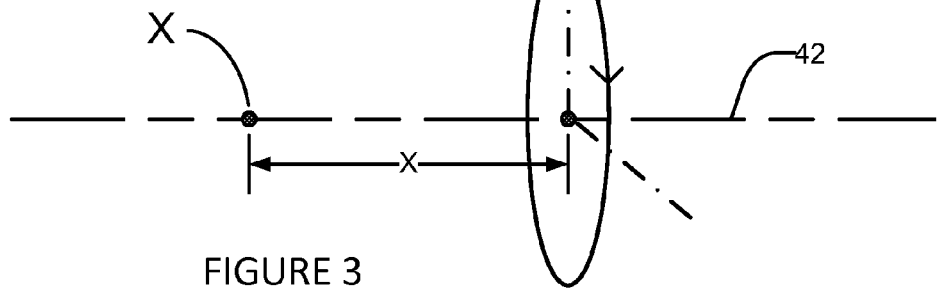
FIG. 3 illustrates the magnetic field produced by an electrical current circulating in a circular loop.

FIG. 3 illustrates the magnetic field produced by an electrical current circulating in a circular loop 40. From the Biot-Savart Law it can be shown that the magnetic field produced at a point X on the axis 42 of loop 40 is given by:

$$B_0(x) = \frac{\mu_0 n I R^2}{2(R^2 + x^2)^{3/2}} \qquad (3)$$

where:

x is the distance of point X along axis 42 from the plane of loop 40;

$B_0(x)$ is the magnetic field at point X;

$\mu_0$ is the magnetic constant (the permeability of free space where loop 40 and the surrounding areas are devoid of matter);

n is the number of turns in loop 40;

I is the current flowing in loop 40; and

R is the radius of loop 40.

If there is a material at point X then the magnetic field from current loop 40 will induce magnetism in the material. The magnitude, M, of the magnetization of the material depends upon the magnetic susceptibility of the material and the strength of the field $B_0$. The magnetic field at a point away from point X will be perturbed by the magnetization of the material at point X. Therefore, changes in the magnetic susceptibility of material in the vicinity of point X can be monitored by measuring changes in the magnetic field at a location away from point X. The magnetic field could be measured, for example, in the plane of current loop 40. In some embodiments, magnetic field detector 34 is located substantially in the plane of current loop 40 inside current loop 40, for example at the center of current loop 40.

In the embodiment illustrated in FIG. 2, magnetic field detector 34 comprises a sensor 44 located on-axis with and substantially in the plane of conductor 37. Sensor 44 and conductor 37 may be mounted in an assembly that is attachable to case 13 of battery 12 adjacent to an electrode 14B.

Sensor 44 has a sensitivity sufficient to detect changes in the magnetic field resulting from changes in the susceptibility of the material of an adjacent electrode 14B. Sensor 44 may optionally comprise a flux concentrator to amplify the magnetic field to be detected. In some embodiments, sensor 44 comprises a magnetic tunnel junction (MTJ). Such sensors are available, for example, from Micro Magnetics Inc. of Fall River Mass., USA. Magnetic field sensors based on a MTJ are described in:

Shen et al. *In situ detection of single micron-sized magnetic beads using magnetic tunnel junction sensors*, Appl. Phys. Lett. 86, 253901 (2005);

B. D. Schrag et al. *Magnetic current imaging with magnetic tunnel junction sensors: case study and analysis*.

A simple MTJ comprises two layers of magnetic material separated by a very thin insulating film. If a voltage is applied across this structure and the insulating layer is thin enough, electrons can flow by quantum mechanical tunnelling through the insulating film. For tunnelling between two magnetized materials, the tunnelling current is maximum if the magnetization directions of the two materials are parallel and minimum if they are aligned antiparallel. Therefore, the tunnelling current, and thus the resistance of the device, will change as external magnetic fields alter the relative magnetic orientations of the layers of magnetic material.

Other magnetic sensors that are sensitive enough to detect changes in the magnetic field resulting from changes in the magnetic susceptibility of battery components may also be used. For example, magneto-electric sensors may be applied. Magnetic field sensors based in the giant magnetoelectric effect are described, for example, in:

Nan et al. *Large magnetoelectric response in multiferroic polymer-based composites* Phys. Rev. B 71, 014102 (2005).

Ryu et al., *Magnetoelectric Effect in Composites of Magnetostrictive and Piezoelectric Materials* Journal of Electroceramics, vol. 8, No. 2, pp. 107-119 (August 2002).

Z P Xing et al., *Modeling and detection of quasi-static nanotesla magnetic field variations using magnetoelectric laminate sensors* Meas. Sci. Technol. 19 015206 (2008)

Podney, U.S. Pat. No. 5,675,252.

Figure 4:
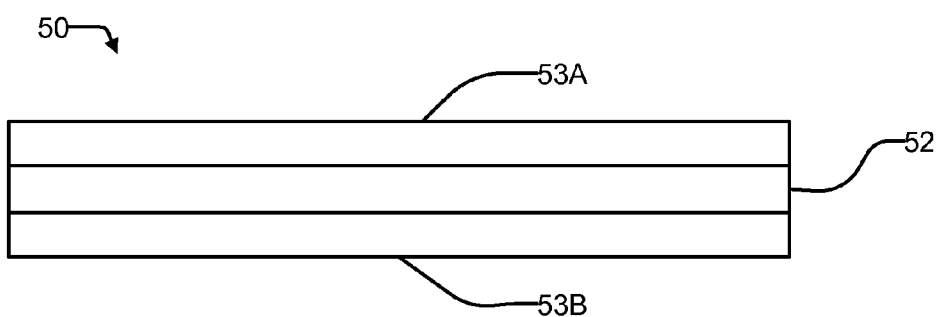
FIG. 4 is a schematic illustration of a magnetic field sensor.

FIG. 4 shows a magnetic field sensor 50 comprising a layer 52 of the giant magnetorestrictive material Terfenol-D sandwiched between layers 53A and 53B of piezoelectric material. The piezoelectric materials may comprise, for example, lead zirconate titanate ("PZT"). Changes in the magnetic field cause magnetostriction in layer 52. This, in turn, causes piezolayers 53A and 53B to change shape and to create a voltage differential between electrodes on the piezolayers. In some embodiments, sensor 50 is designed to have an electromechanical resonant frequency such that sensor 50 is most sensitive at a frequency at or near a frequency of the driving current provided by current source 35.

Other sensitive magnetic field sensors that may have application in some embodiments include:

Superconducting Quantum Interference Detectors (SQUIDS). SQUIDs are very sensitive but may require special operating conditions that may make them unsuitable for some applications.

Sensors exploiting giant magnetoresistance (GMR).

Fiber optic magnetometers.

Sensors exploiting tunnelling magnetoresistance (TMR).

Search coil magnetometers.

Magnetotransistors as described, for example in A. Nathan et al., *How to achieve nanotesla resolution with integrated siliconmagnetotransistors*, Electron Devices Meeting, 1989. IEDM '89, pp. 511-514 (3-6 Dec. 1989).

Ultra-sensitive Hall effect sensors as described, for example, in Nguyen Van Dau F., *Magnetic sensors for nanotesla detection using planar Hall effect*, Sensors and actuators. A, 1996, vol. 53, no 1-3, pp. 256-260.

The sensitivity required for magnetic field sensor 50 will depend on factors including: the strength of the magnetic field generated by magnetic field source 32; the geometries of magnetic field source 32 and magnetic field sensor 50; the geometry of the electrode 14 in which chemical changes occur; and the distances between magnetic field source 32, magnetic field sensor 50, and the electrode 14.

Figure 5:
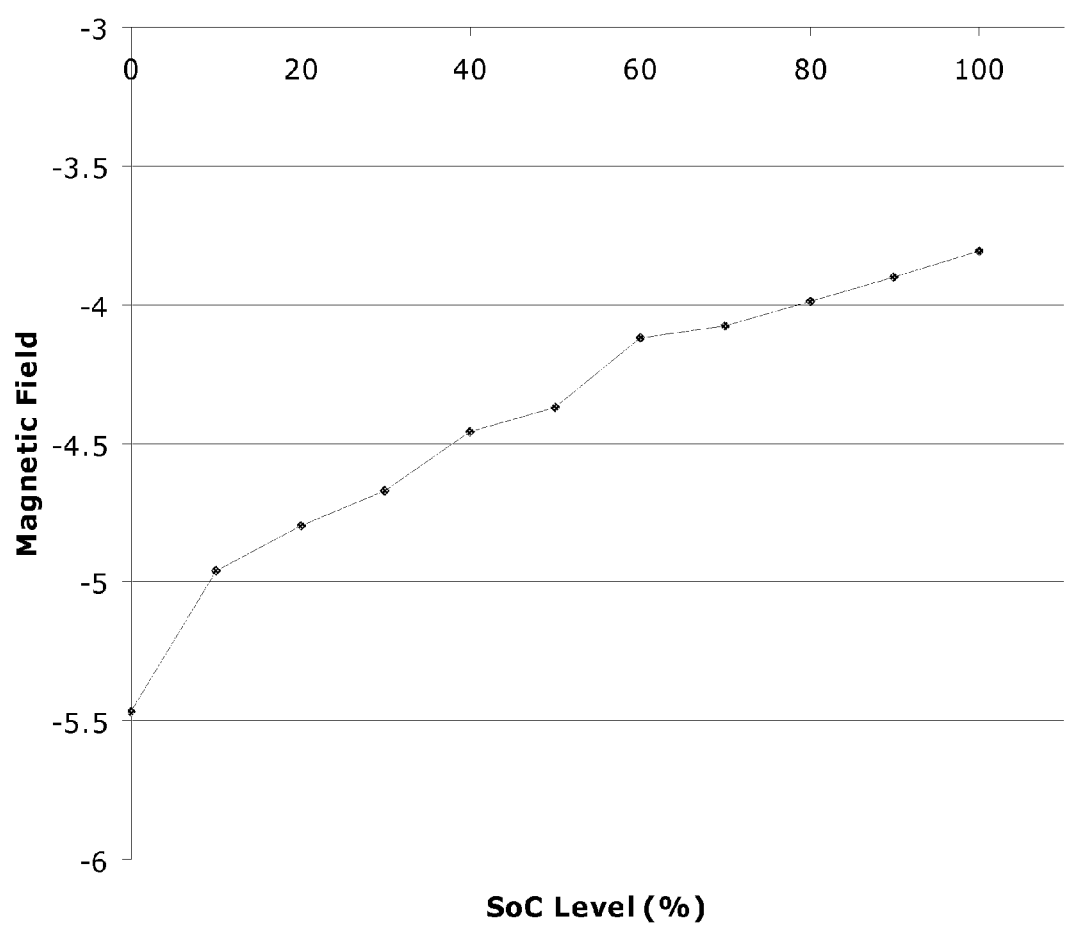
FIG. 5 is a graph which includes a curve illustrating measured magnetic susceptibility of a battery electrode as a function of the state of charge of the battery.

FIG. 5 is a graph which includes a curve illustrating measured magnetic susceptibility of a battery electrode as a function of the state of charge of the battery. It can be seen that there is a strong correlation between the detected magnetic field and the state of charge of the battery being tested. The graph of FIG. 5 was obtained using an AGM SLI (starting lighting ignition) battery with a capacity of 90 Ahr. Measurements were made using a 25 A discharge current from a fully charged battery down to a voltage of 10.5 V at 20° C. The sensor was located directly on the side of the battery adjacent to one electrode.

In some embodiments, the frequency of electrical current source 35 is variable. Such embodiments may obtain additional information regarding a battery by monitoring magnetic susceptibility of a battery component at two or more different frequencies. The depth of penetration of a magnetic field into a material decreases as frequency increases. The penetration depth is approximated by the skin depth given by:

$$\zeta = \frac{1}{\sqrt{\pi \mu \theta f}} \quad (4)$$

where: $\zeta$ is the skin depth; $\mu$ is the magnetic susceptibility of the material; $\theta$ is the electrical conductivity of the material and f is the frequency. At 10 kHz, $\zeta$ is about 2 mm in some materials of interest. By making measurements using magnetic fields which fluctuate at different frequencies (e.g. by varying the frequency of AC or pulsed DC current driving an electromagnet that generates a magnetic field), one can sense the degree to which chemical changes associated with charging or discharging a battery have occurred at different depths within an electrode of a battery.

In some embodiments, a tester according to the invention measures magnetization of an electrode of a battery under test in response to magnetic excitation at two or more frequencies and bases a determination of the state of charge of the battery on the measured magnetization at each of the two or more frequencies. Measurements at different frequencies may be made at different times or at the same time. Obtaining the measure of state of charge may comprise, for example taking an average or weighted average of values obtained for the two or more frequencies of magnetic excitation.

Some embodiments comprise a control system configured to adjust a frequency of magnetic excitation to a frequency that suits a particular battery. This may be done, for example, by varying the frequency to at least approximately identify a transition frequency that is the highest frequency at which the magnetic field fully penetrates the electrode being monitored. The transition frequency may be identified, for example, by sweeping the frequency down from a high frequency and determining the frequency at which the detected magnetism exhibits characteristics that indicate that the magnetic field of electrolyte on a far side of the electrode is being detected.

Some embodiments provide a sensor assembly that comprises a substrate that is attachable to a case of a battery and, supported on the substrate, some or all of:
 A coil or other magnetic field source.
 A magnetic field detector.
 Signal processing circuitry connected to provide preliminary processing for a signal output by the magnetic field detector. The signal processing circuitry may comprise, for example, one or more of: an amplifier, one or more filters (which may serve as a bandpass filter), and artifact rejection circuits.
 A driving circuit for the magnetic field detector. The driving circuit may comprise, for example, a circuit that provides suitable bias voltages and/or supplies electrical current to the magnetic field detector.

In some embodiments, the sensor assembly comprises adhesive spots or an adhesive layer that permits a face of the sensor assembly to be adhered to a face of a battery. In some embodiments all circuitry and other components on the substrate are encapsulated or otherwise protected. In some embodiments the outer case of a battery has a recess and the sensor assembly is affixed to the battery in the recess. In such embodiments the sensor assembly is protected somewhat against mechanical damage by being inlaid into a face of the battery. In some embodiments the substrate is flexible so that it can conform well to a surface of the battery. In some embodiments the substrate is generally planar so that it can conform to a generally planar face of a battery. In some embodiments the substrate is curved so that it can conform to a curved face of a battery.

Figure 6:
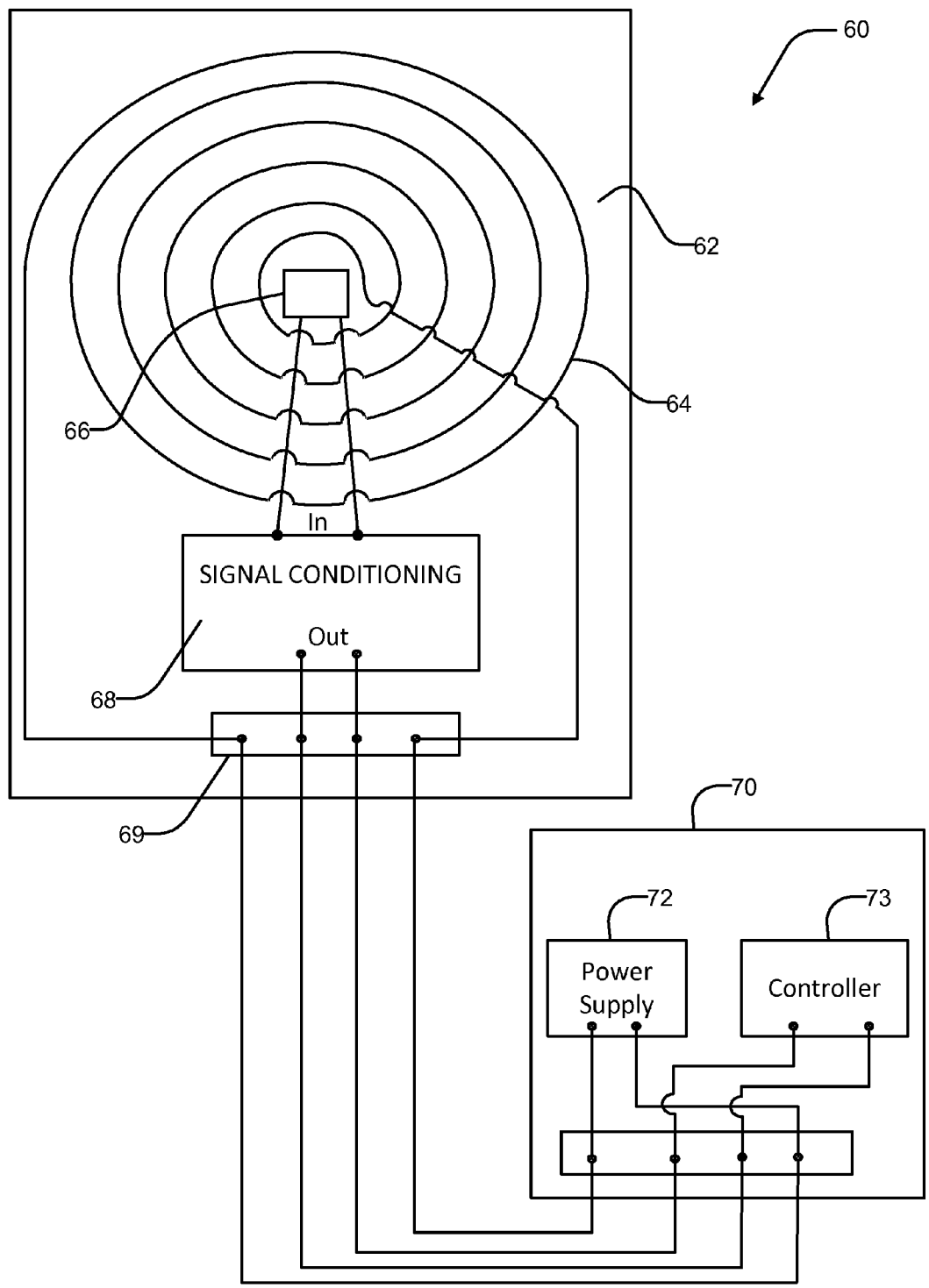
FIG. 6 shows a sensor assembly.

FIG. 6 shows a sensor assembly 60 comprising a substrate 62, coils 64 for generating a magnetic field, a magnetic field detector 66 and signal processing circuits 68. A connector 69 permits connection to an external apparatus 70 which includes a power supply 72 for supplying current to coils 64 and a controller 73 which evaluates a state of a battery based at least in part on signals from magnetic field detector 66 and takes actions such as:
 Displaying a state of charge of the battery on a display.
 Computing an estimated run-time before the battery reaches a predetermined state of charge.
 Disconnecting optional loads and/or shifting loads into power-conserving modes in response to a determination that the state of charge of the battery has fallen to below a threshold level.
 Signalling to other components to indicate a state of charge of the battery.
 etc.

In some embodiments, the battery is a battery in a vehicle and external apparatus 70 is connected to a data communication bus of the vehicle. In some embodiments the data communication bus is a Controller Area Network ("CAN") or Local Interconnect Network ("LIN") bus. Apparatus 70 may send signals over the data communication bus to other components. The signals may cause the other components to switch to a different operating mode and/or shut down or start up as a result of a change in the state of a battery being monitored.

Alternative embodiments differ from the example apparatus described above in various ways. For example:
 A permanent magnet could be used in place of an electromagnet to generate a magnetic field.
 A battery testing apparatus may operate as described herein and also receive other information regarding a battery. For example, characteristics such as: the complex impedance of the battery at different frequencies, the charge or discharge current of the battery, and/or the voltage of the battery may be monitored. These additional measurements may be combined with information from magnetic susceptibility measurements as described herein to obtain enhanced information regarding the state of the battery being monitored.
 Some components of a battery testing apparatus could be built into a battery. For example, a magnetic field sensor could be embedded within a battery electrode. A coil for inducing a magnetic field in a battery electrode could be located inside a battery case and could be embedded within a battery electrode. A magnetic field sensor and coil could be embedded within a wall of a battery case.
 An applied magnetic field could be generated by current flowing in the battery for supply to a load. Apparatus may include a current sensor that monitors current supplied by the battery and correlates fluctuations in the supplied current to fluctuations in a detected magnetic field.

Figure 7:
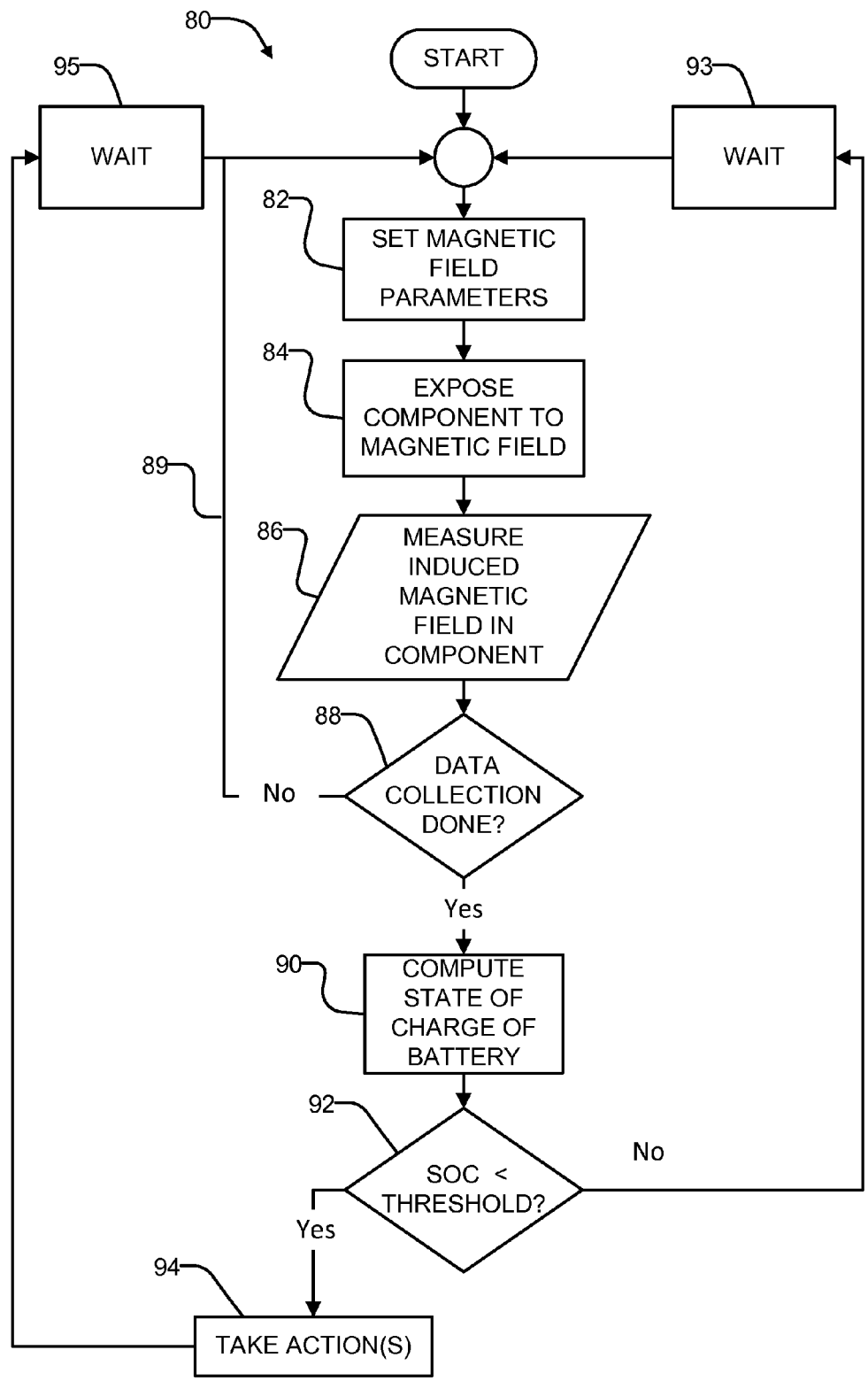
FIG. 7 is a flowchart showing an example method for monitoring the state of a battery.

FIG. 7 is a flowchart illustrating a method 80 according to some example embodiments of the invention. Magnetic field parameters are optionally set in block 82. In block 84 a battery component is exposed to at least a first magnetic field. A magnetic field induced in the battery component is measured in block 86.

In some embodiments, multiple magnetic fields induced in the component are measured. In such embodiments, different magnetic fields (e.g. magnetic fields having different intensities, different polarizations or different time variations may be used for some or all of the multiple measurements. In such embodiments, block 88 determines whether data collection is complete. If not, method 80 repeats blocks 82, 84 and 86 to obtain an additional measurement as indicated by path 89.

When data collection is complete (YES result from block 88) method 80 proceeds to block 90 which determines the state of the battery from the collected data. The state determined in block 90 may comprise the State of Charge of the battery. In block 92 the state of charge is compared to a threshold. If the comparison indicates that the battery is charged sufficiently then method 80 proceeds to block 93 and waits until an appropriate time to measure the state of the battery again. If block 92 determines that the state of charge of the battery is lower than some threshold then one or more appropriate actions are taken in block 94 due to a threshold being exceeded and then method 80 proceeds to block 95 and waits until an appropriate time to measure the state of the battery again.

Some embodiments operate in a mode wherein measurements of the magnetic susceptibility of an electrode or other battery component are made by applying an electromagnetic excitation, stopping or reducing the electromagnetic excitation and then measuring the induced magnetism in the form of a residual magnetic field of the electrode or other structure while the excitation field is off or reduced in intensity. Such embodiments can be advantageous because small differences in the magnetic field of the electrode or other structure can be easier to measure in the absence of the excitation field. In such embodiments, the excitation field is preferably discontinued sharply (as opposed to gradually ramping down the excitation field) to avoid degaussing effects.

A residual field of an electrode or other battery structure may persist for only a limited time after the excitation field is turned off. The residual field starts to decay immediately after the excitation field the is turned off. Therefore, it is desirable to measure the residual magnetic field of the electrode or other structure within a short window after the excitation field is turned off. Some embodiments have a controller configured to: apply an excitation field (for example as described in any of the embodiments above) for a period of time; turn off the excitation field; and measure the residual magnetic field in a time window immediately after the excitation field has been turned off. This may optionally be repeated several times and results combined.

It is not necessary to apply the excitation field for a very long time. Although not mandatory it is desirable to apply the excitation field for long enough for a steady-state condition to develop. For example, in some embodiments the excitation field is applied for 10 seconds or less. In some embodiments the excitation field is applied for 4-8 seconds before it is shut off.

For example, measurement of the residual magnetic field may be made within approximately 2 seconds after turning off the excitation field in some embodiments. It is desirable to measure the residual magnetic field of the electrode or other battery structure at a fixed time after the excitation field is discontinued within a time window in which a residual field of the electrode or other battery component is detectable. The time window within which the residual field can be measured is a function of the nature of the excitation field, the geometry and the material of the electrode or other structure for with the residual field is measured. This time window can therefore vary among batteries of different chemistries, materials and constructions. Measurements of the residual field may be made a very short time after turning off the excitation field.

The magnetic field detected after the excitation field has been turned off may comprise a component due to a residual field within the coil or other field generator. This residual generator field may be accounted for by measuring the residual generator field after the residual field from the battery component has mostly died away (e.g. after 2 seconds or so). The measured residual generator field may be subtracted from the initial measurement of the residual field. For example, in some embodiments, a controller causes application of a selected excitation field for a period of time, discontinues the excitation field, waits for a first time interval, makes a first magnetic field measurement, waits for a second time interval, and makes a second magnetic field measurement. The controller may be configured to determine a measure of a battery characteristic (e.g. SoC, SoH and/or SoF) based on the first and second measurements. In some embodiments the controller is configured to determine the battery characteristic based at least in part on a difference between the first and second measurements. In some embodiments, the sum of the first and second intervals is longer than a time for residual magnetism in the electrode or other battery component to die away to 10% or less (or 5% or less or 2% or less or 1% or less) of its value immediately after discontinuation of the excitation field. In some embodiments the sum of the first and second intervals is 1½ seconds or more.

For typical geometries the excitation field produces circulating electrical currents within the electrode or other battery structure being investigated. These circulating currents, in turn, produce a magnetic field. For some geometries the circulating currents are coaxial with a coil used to generate the excitation field and the resulting magnetic field lines are such that a magnetic field sensor can best detect the residual magnetic field of the electrode or other battery component if the sensor is located off of the axis of the coil. In some embodiments the sensor is oriented in a direction such that the sensor is most sensitive to magnetic fields having a direction perpendicular to a direction of the excitation magnetic field and/or a residual generator field at the location of the sensor.

Various frequency components of the residual field may be measured. A power analysis of the FFT spectrum for a typical residual field contains a DC field component and also an AC field component having a peak at a frequency of the excitation field. Either or both of these components may be measured and used for determining battery characteristics. One advantage of measuring the AC field component is rejection of magnetic fields from other sources such as from currents flowing due to loading or charging of the battery.

In some embodiments a combination of excitation fields is applied. For example, the amount of residual magnetism can be increased by first applying a lower frequency excitation field and immediately (or within a short period such as within 4 seconds) after that applying a higher frequency excitation field.

Apparatus and methods as described herein may be applied to measure the State of Health (SoH) of batteries. For example, the SoH of a lithium ion battery is typically described as a measure of capacity. As a lithium ion battery ages the number of lithium ions available to be transferred between the electrodes decreases. An observable difference between a new battery (having a high SoH) and an identical but aged battery (having a low SoH) is that, for the same state of charge, the magnetic susceptibility of the negative electrode in the aged battery will be lower than that of the new battery. This is because, in the aged battery, the number of available lithium ions in the negative electrode will be lower than in the new battery Hence, if the SoC level of a battery is known then a comparative measure may be made to indicate SoH.

In an example embodiment, SoH is measured while a battery is fully charged (100% SoC). This is a convenient SoC to use because it can be achieved by fully charging the battery. For example, SoH may be measured by measuring the magnetic susceptibility of a negative electrode of the battery when the battery is fully charged and comparing the result of the measurement to the magnetic susceptibility the same electrode had when new (or at some other time when the battery had a known SoH).

Figure 8:
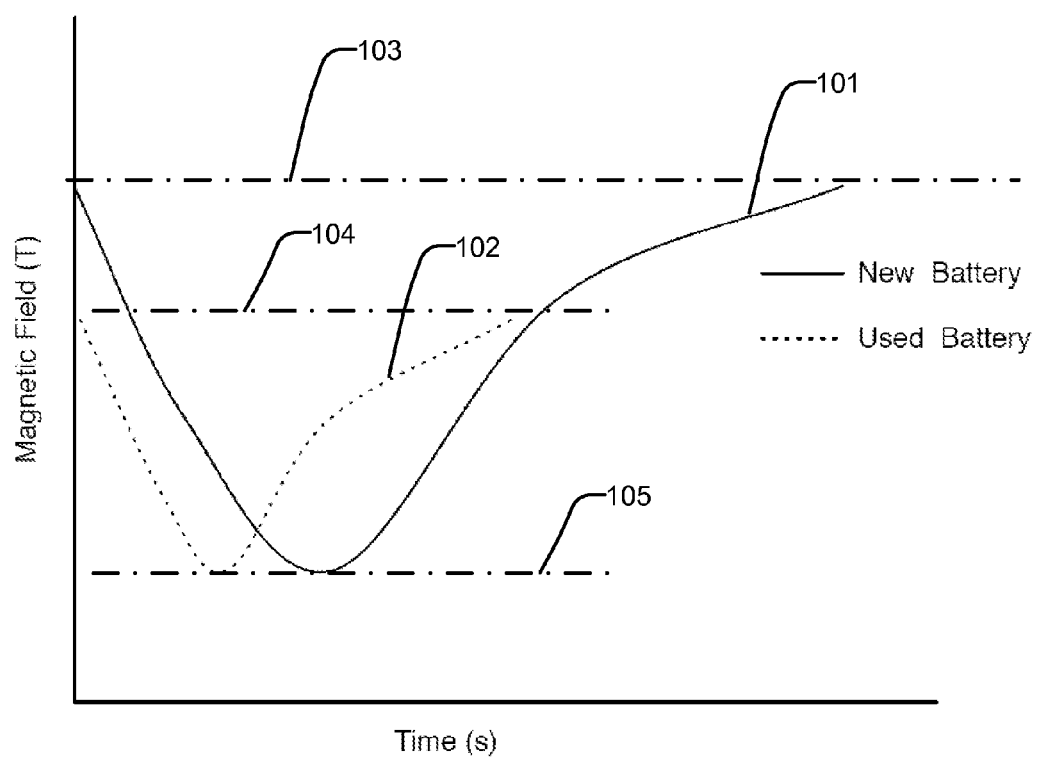
FIG. 8 is a plot comparing magnetic susceptibility of a negative electrode of a lithium ion battery as a function of state of charge for a new battery and a used battery.

FIG. 8 is a plot comparing magnetic susceptibility of a negative electrode of a lithium ion battery as a function of state of charge for a new battery and a used but otherwise identical battery. Curve 101 is for the new battery and curve 102 is for the used battery. In each case, the battery started fully charged, was fully discharged at a constant rate and was then charged until fully charged. Magnetism induced in negative electrodes of the batteries by an electromagnetic excitation field was measured.

In the new battery the induced magnetism had a value 103 when the new battery was fully charged. In the used battery the induced magnetism had a lower value 104 when the used battery was fully charged. A difference between levels 103 and 104 may be used as an indication of SoH for a battery.

An advantage of this technique over some existing methods for measuring SoH is that, as can be seen from FIG. 8, the induced magnetization level 105 which corresponds to a full discharge (0% SoC) is essentially the same for the new and used batteries. This is advantageous because measures of SoH should provide an indication of battery capacity. Since battery capacity is related to the difference between the fully-charged and fully-discharged states of the battery, if induced magnetization level 105 corresponding to the fully discharged condition shifted with battery aging it would be unlikely that a measure of the induced magnetization level 104 corresponding to the fully-charged condition would provide on its own a reliable indication of SoH. While it is not mandatory that SoH be based solely on induced magnetization level 104, one advantage of some embodiments is that a measure of SoH can be based on induced magnetization level 104.

The SoH can be based on a measurement of induced magnetization at a state of charge other than fully-charged (100% SoC) if such a SoC can be reliably achieved.

In some embodiments, variation between sensors is eliminated by a method which uses the same apparatus to measure an induced magnetization of a battery component when the battery is new and to measure changes in the induced magnetization as the battery ages. For example, a battery may be provided with a monitoring system comprising a magnetic susceptibility meter which may, for example, have a construction as described in any of the embodiments herein. A method may charge the battery to a fully-charged state (or another well-defined SoC) and then measure induced magnetization of a battery component (e.g. an electrode, for example, a negative electrode of a lithium ion battery) using the magnetic susceptibility meter. The induced magnetization or another measure of magnetic susceptibility of the component may be stored for future reference. In some embodiments, the induced magnetization or other measure of magnetic susceptibility of the component is stored in a data store such as a non-volatile memory. In some embodiments the data store is attached to the battery and/or integrated with the magnetic susceptibility meter.

In some embodiments calibration information such as a calibration table relating SoH to induced magnetization or other measure of the magnetic susceptibility of the component is derived from the initial measurement of the induced magnetization or other measure of the magnetic susceptibility of the component. The calibration table or parameters defining the calibration table may be stored in a memory, lookup table or other data store. In some embodiments the data store is attached to the battery and/or integrated with the magnetic susceptibility meter. At later times the battery may be charged to a fully charged state (or other well-characterized SoC) and the magnetic susceptibility meter operated to measure the induced magnetization or other measure of the magnetic susceptibility of the component. The SoH of the battery may be determined from the calibration information and/or from a comparison of the original induced magnetization or other measure of magnetic susceptibility to the later measurement of the induced magnetization or other measure of magnetic susceptibility.

Some embodiments provide apparatus comprising a magnetic susceptibility meter and a controller configured to perform a method for determining SoH as described above. The apparatus may be like the apparatus shown in FIG. 1 or 2 for example. In some embodiments the apparatus additionally comprises a battery charger. The controller may control the battery charger to fully-charge the battery for the purpose of a SoH measurement. In the alternative, the controller may determine when the battery has been fully charged by the charger and may operate the susceptibility meter to obtain a measurement from which SoH of the battery may be determined when the battery has been fully charged.

Figure 9:
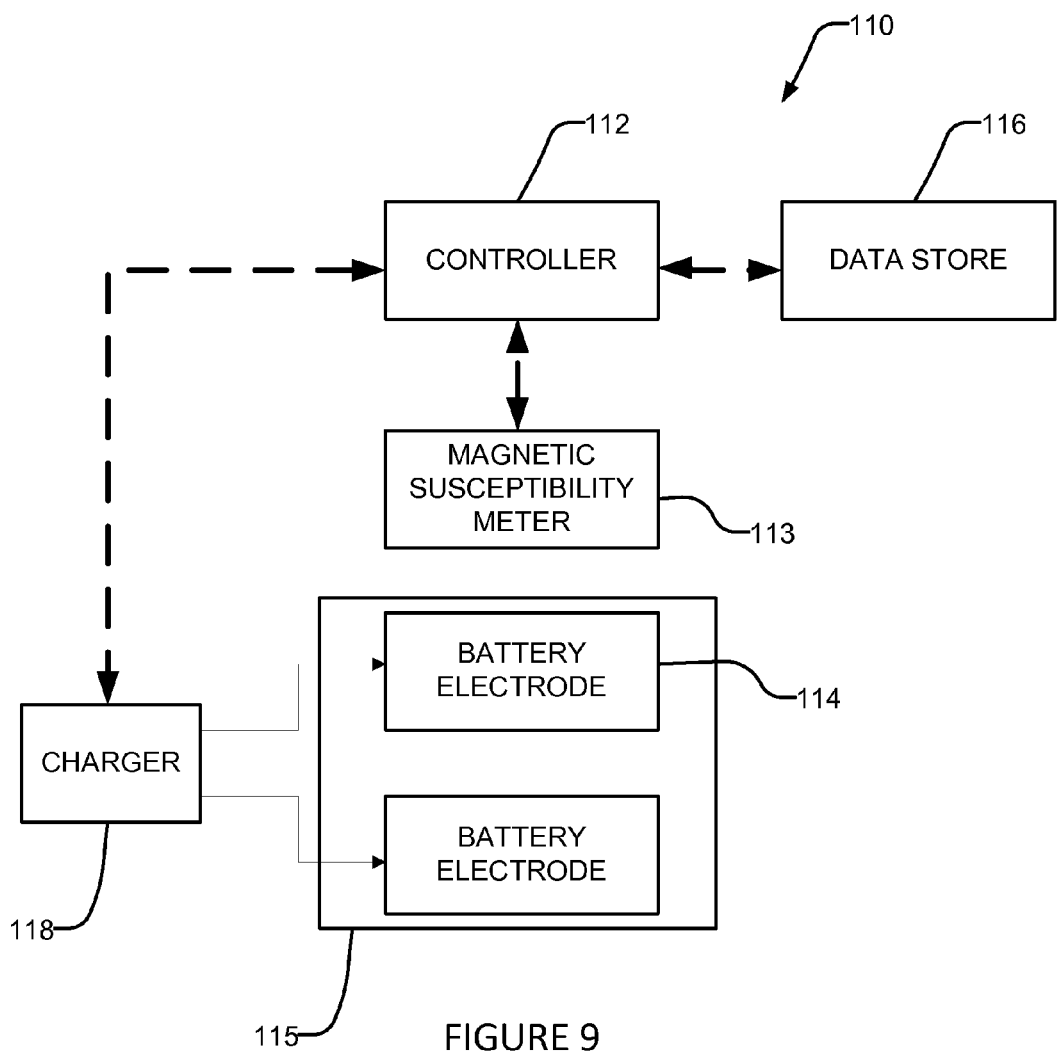
FIG. 9 is a block diagram of a battery testing system according to another example embodiment of the invention.

FIG. 9 illustrates an example apparatus 110 comprising a controller 112 connected to receive a signal from a magnetic susceptibility meter 113 located to measure magnetic susceptibility of an electrode 114 in a battery 115. Controller 112 can read and write data to a data store 116. A charger 118 is connected to charge battery 115. Charger 118 may be operated under the control of controller 112 and/or controller 112 may receive signals from charger 118 indicative of a charge status of battery 115.

Controller 112 may be configured to perform an initialization routine when battery 115 is new. The initialization routine may, for example, cause controller 112 to initiate charging of battery 115 until battery 115 is fully charged. The initialization routine may then cause magnetic susceptibility meter 113 to measure magnetic susceptibility of electrode 114 of battery 115. The initialization routine may then cause controller 112 to store a result of the susceptibility measurement or data derived from the susceptibility measurement (calibration data) in data store 116. The calibration data is derived from the result of the susceptibility measurement and may comprise, for example, one or more of a value, a lookup table, a function, one or more parameters for a function or the like.

Subsequently, controller 112 may, on its own initiative (triggered e.g. by a timer and/or by detecting that battery 115 is fully charged (or has another specific state of charge)) or on the initiative of a user as evidenced by a control input execute a SoH measurement routine. The SoH measurement routine may coordinate the operation of magnetic susceptibility meter 113 to make measurements for determining a SoH of battery 115. In an example embodiment the SoH determination routine may for example, cause controller 112 to initiate charging of battery 115 until battery 115 is fully charged. The SoH determination routine may then cause magnetic susceptibility meter 113 to measure magnetic susceptibility of electrode 114 of battery 115. The SoH determination routine may then cause controller 112 to derive a measure of SoH of battery 115 using the calibration data previously stored in data store 116. This may be done by one or more of: comparing a result of the susceptibility measurement or data derived from the susceptibility measurement to the information stored in data store 116 and/or using the result of the susceptibility measurement or data derived from the susceptibility measurement to look up an indicator of SoH of battery 115 in a table or other data structure from data store 116 and/or may processing the result of the susceptibility measurement or data derived from the susceptibility measurement according to a function defined in whole or in part by software elements and/or parameters from data store 116. Controller 112 may display or otherwise make available for use an indication of the SoH of battery 115. The indication may be human perceptible or a signal readable by a machine.

It is also possible to use information from testing as described herein to determine a state of function (SoF) of a battery. SoF represents an available charge that the battery can supply. For example, a new battery that is ½ charged may be able to deliver a similar charge as a used battery that is ¾ charged. A user may wish to know how much energy a battery can deliver before it is flat instead of how well does the battery match its specifications. Magnetic susceptibility measurements as described herein can effectively measure the available current carriers (e.g. stored lithium ions in the anode) so that a measure of how much electrochemical work the battery can perform can be derived from the magnetic susceptibility measurements.

The invention may be embodied in a range of ways including, without limitation:
  Methods for monitoring the state (particularly the state of charge) of batteries.
  Apparatus for testing the state (particularly the state of charge) of batteries.
  Batteries having built in components for use in monitoring according to a method as described herein.
  Sensor assemblies that can be attached to batteries for use in monitoring according to a method as described herein.

Certain implementations of the invention comprise computer processors which execute software instructions which cause the processors to perform a method of the invention. For example, one or more processors in a battery tester may implement methods for determining the state of charge of batteries based on measured induced magnetic fields by executing software instructions in a program memory accessible to the processors. The invention may also be provided in the form of a program product. The program product may comprise any medium which carries a set of computer-readable instructions which, when executed by a data processor, cause the data processor to execute a method of the invention. Program products according to the invention may be in any of a wide variety of forms. The program product may comprise, for example, magnetic data storage media including floppy diskettes, hard disk drives, optical data storage media including CD ROMs, DVDs, electronic data storage media including ROMs, flash RAM, or the like. The computer-readable signals on the program product may optionally be compressed or encrypted.

Where a component (e.g. a software module, processor, assembly, device, circuit, sensor, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true scope.

What is claimed is:

1. A method for determining a state of an electrochemical battery, the method comprising:
  exposing an electrode of the electrochemical battery to an electromagnetic excitation field;
  measuring magnetism induced in the material of the electrode by the electromagnetic excitation field; and
  determining the state of the electrochemical battery based at least in part on the measured induced magnetism;
wherein the method comprises causing the electromagnetic excitation field to vary at a frequency and discontinuing the electromagnetic excitation field before measuring the induced magnetism and
  varying the frequency at which the excitation field varies and identifying a transition frequency, the transition frequency corresponding to a highest frequency at which the magnetic field component of the electromagnetic excitation field fully penetrates the electrode being monitored.

2. The method according to claim 1 wherein the frequency is in the range of 1 kHz to 20 kHz.

3. The method according to claim 1 comprising, after identifying the transition frequency, varying the excitation field at the transition frequency.

4. The method according to claim 1 wherein exposing the electrode to the electromagnetic excitation field comprises, for a first interval, exposing the electrode to a first electromagnetic excitation field of a first frequency and for a second interval exposing the electrode to a second electromagnetic excitation field having a second frequency higher than the first frequency.

5. The method according to claim 1 wherein the state comprises a state of health of the battery and the method comprises charging the battery to a known state of charge before measuring the induced magnetism.

6. The method according to claim 5 wherein the known state of charge is fully charged.

7. The method according to claim 5 wherein determining the state of health comprises comparing a measure of the induced magnetism to a stored value representing the induced magnetism when the electrochemical battery had a known state of health.

8. The method according to claim 7 wherein determining the state of health comprises comparing a measure of the induced magnetism to a stored value representing the induced magnetism when the electrochemical battery was new.

9. The method according to claim 1 wherein the electrode is adjacent to a wall of a case of the battery and the method comprises measuring at a location outside of the case a magnetic field resulting from magnetism induced in the electrode.

10. The method according to claim 1 wherein the state is a state of charge of the battery.

11. Apparatus for determining a state of an electrochemical battery, the apparatus comprising:
- an excitation field generator configured to apply an electromagnetic excitation field to an electrode of the electrochemical battery;
- a magnetic field detector positionable to determine an induced magnetization induced in the material of the electrode by the excitation field; and,
- a controller configured to determine the state of the electrochemical battery based at least in part on the induced magnetization wherein the controller is configured to:
cause the electromagnetic excitation field to vary at a frequency;
discontinue application of the electromagnetic excitation field before measuring the induced magnetism; and
vary the frequency at which the excitation field varies and identify a transition frequency, the transition frequency corresponding to a highest frequency at which the magnetic field component of the electromagnetic excitation field fully penetrates the electrode being monitored.

12. The apparatus according to claim 11 wherein the state is a state of charge of the electrochemical battery and the controller is configured to receive a signal indicative of the induced magnetism and to estimate the state of charge of the electrochemical battery based at least in part on the signal.

13. The apparatus according to claim 12 wherein the controller is configured to display on a display the estimate of the state of charge of the battery.

14. The apparatus according to claim 13 wherein the controller comprises a calibration function, the calibration function providing a relationship between values of the signal and corresponding states of charge of the battery.

15. The apparatus according to claim 14 wherein the calibration function comprises a lookup table and the controller is operable to look up the state of charge using a value of the signal as a key.

16. The apparatus according to claim 11 wherein the controller is configured to determine the value of the signal when the electrochemical battery has a known state of charge and to determine a state of health of the electrochemical battery based at least in part on the value of the signal.

* * * * *